United States Patent [19]

Rossman et al.

[11] Patent Number: 5,748,434
[45] Date of Patent: May 5, 1998

[54] SHIELD FOR AN ELECTROSTATIC CHUCK

[75] Inventors: Kent Rossman, Sunnyvale; Brian Lue, Mountain View; Fred C. Redeker, Fremont, all of Calif.

[73] Assignee: Applied Materials, Inc., Santa Clara, Calif.

[21] Appl. No.: 663,886

[22] Filed: Jun. 14, 1996

[51] Int. Cl.[6] ............................ H02N 13/00
[52] U.S. Cl. ............................ 361/234
[58] Field of Search ............... 361/234; 279/128

[56] References Cited

U.S. PATENT DOCUMENTS

| | | | |
|---|---|---|---|
| 4,113,547 | 9/1978 | Katz et al. | 156/612 |
| 4,645,218 | 2/1987 | Ooshio et al. | 279/1 M |
| 5,037,262 | 8/1991 | Moll et al. | 414/222 |
| 5,099,571 | 3/1992 | Logan et al. | 29/825 |
| 5,158,644 | 10/1992 | Cheung et al. | 156/643 |
| 5,271,788 | 12/1993 | Hasegawa et al. | 156/345 |
| 5,292,554 | 3/1994 | Sinha et al. | 427/251 |
| 5,384,008 | 1/1995 | Sinha et al. | 156/643 |
| 5,411,624 | 5/1995 | Hirano et al. | 156/345 |
| 5,427,620 | 6/1995 | deBoer et al. | 118/725 |
| 5,431,737 | 7/1995 | Keller et al. | 118/729 |
| 5,452,510 | 9/1995 | Barnes et al. | 29/825 |
| 5,460,703 | 10/1995 | Nulman et al. | 204/192.12 |
| 5,463,525 | 10/1995 | Barnes et al. | 361/234 |
| 5,529,657 | 6/1996 | Ishii | 156/345 |
| 5,556,500 | 9/1996 | Hasegawa et al. | 156/345 |

*Primary Examiner*—Fritz Fleming
*Attorney, Agent, or Firm*—Townsend and Townsend and Crew LLP

[57] ABSTRACT

A shield (5) for an electrostatic chuck (4) includes a first shield member (60) circumscribing the chuck and a second shield member (62) supported over the first shield member. The second shield member has an upper surface surrounding the wafer and exposed to deposition from gases within the process chamber. Splitting the shield into two members increases the ratio of exposed surface to thermal mass of the second shield member, which increases the temperature of the second shield member during processing, thereby decreasing the rate of deposition thereon. In addition, the clean rate or deposition removal rate of the shield is typically a function of its temperature (i.e., the hotter the shield becomes during processing, the faster it can be cleaned). Therefore, the clean rate of the second shield member will be increased, thereby enhancing the throughput of the process.

23 Claims, 3 Drawing Sheets

SHIELD FOR AN ELECTROSTATIC CHUCK

BACKGROUND OF THE INVENTION

The present invention relates to the fabrication of integrated circuits. More particularly, the invention provides an improved shield for an electrostatic chuck and a method for clamping a semiconductor wafer onto the electrostatic chuck.

Electrostatic chucks are devices which have gained wide usage in the semiconductor industry for clamping semiconductor wafers during manufacturing processes, such as high density plasma reactions. Electrostatic chucks employ an electrostatic force between oppositely charged surfaces to secure the wafer to the chuck. Fabrication of electrostatic chucks typically involves machining a process-compatible metal, such as aluminum, into a suitable support pedestal and grit blasting the top surface of the pedestal. A layer of dielectric material, such as ceramic, is then applied to the upper surface of the pedestal and ground to a smooth, planar, upper surface for supporting the wafer. During processing, a voltage is applied between the wafer and the metal pedestal, producing a positive charge on one side of the dielectric layer and a negative charge on the other side. This charge generates an attractive, substantially uniform, coulomb force therebetween that secures the wafer to the dielectric layer.

During wafer processing, the electrostatic chuck is often subjected to ion bombardment and high frequency or radiofrequency (RF) energy from the processing chamber. Over time, the ions and RF energy may damage portions of the ceramic coated electrostatic chuck. To protect the chuck and thereby increase its lifetime, a shield, often termed a "process kit", is positioned around the electrostatic chuck within the processing chamber. The shield is typically an annular collar that surrounds the chuck and comprises an insulating material, such as a dielectric material. The insulating collar may also serve to channel energy through the chuck, thereby focusing energy, onto the wafer. In addition, the insulating collar is typically positioned above the dielectric layer of the electrostatic chuck to form an inner recess for receiving the wafer. Thus, if the electrostatic force provided by the chuck is lost, the insulating collar inhibits the wafer from sliding away from the upper surface of the dielectric layer (e.g., due to pressure from helium cooling gas underneath the wafer).

One of the drawbacks with existing shields or insulating collars for electrostatic chucks is that they generally require a long time to clean, which reduces the throughput of the wafer manufacturing process. The exposed surfaces of insulating collars, like the exposed surfaces of other components within the process chamber, are typically cleaned after they have been subjected to oxide deposition from process gases, such as $SiO_2$. These deposits must be removed periodically. Since the upper surface of the insulating collar is located adjacent to the wafer, this surface generally receives large amounts of oxide deposition compared to the other surfaces in the process chamber. In fact, this oxide deposition on the upper surface of the insulating collar is often so great that the clean rate (i.e., the oxide deposition removal rate) of the entire process chamber is typically a function of the clean rate of the insulating collar.

SUMMARY OF THE INVENTION

The present invention provides an improved shield for an electrostatic chuck in a semiconductor processing chamber that is designed to inhibit the deposition of gaseous products thereon. In addition, the shield is designed so that oxide deposition can be removed relatively quickly, which enhances the throughput of the wafer manufacturing process.

The apparatus of the present invention includes an electrostatic chuck comprising an electrically conductive pedestal and an electrically insulating layer, such as a dielectric coating, disposed between the pedestal and the semiconductor wafer. The shield includes a first shield member at least partially circumscribing the pedestal and a second, separate shield member supported over the first shield member and defining an upper, exposed surface adjacent to the wafer. The second shield member is substantially thermally isolated from the first shield member so that it will receive a substantially large amount of heat during processing from RF energy in the process chamber, for example. Since the oxide deposition rate is generally inversely proportional to the temperature of a surface in the process chamber, the heat received by the second shield member inhibits oxide deposition on the exposed upper surface.

The present invention splits the shield into first and second substantially thermally isolated shield members to thereby increase the exposed surface-to-thermal mass ratio of the second shield member. Although the first and second shield members are in contact with each other, they are separated by a small interstitial gap, which effectively prevents thermal conduction therebetween in the low-pressure environment of the processing chamber (typically on the order of 5 milliTorr). Therefore, the second shield member will be heated to a substantially high temperature from the ion bombardment in the chamber, which decreases the rate of deposition on the upper exposed surface of the second shield member. In addition, the clean rate or oxide deposition removal rate of the shield is also typically a function of its temperature (i.e., the hotter the shield, the faster it can be cleaned). Therefore, the relatively lower thermal mass of the second shield increases its clean rate, which enhances the throughput of the process.

In a specific configuration, the upper surface of the second shield member is positioned below the upper surface of the wafer. This further decreases the oxide deposition rate on the second shield member and provides an improved line of sight to the wafer edges. Therefore, the edges of the wafer may have a higher deposition rate than if the second shield member were in a higher position. In some processes, this lower position of the second shield member may be advantageous to compensate for the higher deposition rate in the center of the wafer that would typically occur during processing.

The second shield member further includes one or more tabs extending upward from its upper surface. The tabs are circumferentially spaced around the wafer to hold the wafer to the electrostatic chuck in the event that the electrostatic force is not sufficient for this purpose. For example, cooling gas is often delivered to the interstitial spaces between the semiconductor wafer and the chuck to decrease the temperature of the wafer. This cooling gas impinges on the backside of the wafer and urges the wafer away from the chuck. If excess cooling gas is accidently delivered to the wafer by the operator, the tabs help to prevent the wafer from being driven off the electrostatic chuck. Preferably, the tabs are elongate members that extend slightly above the wafer's upper surface. This geometry decreases the profile of the tabs to minimize interference with the uniformity of deposition on the wafer and to minimize oxide deposition on the elongate tabs.

DESCRIPTION OF THE SPECIFIC EMBODIMENTS

Figure 1:
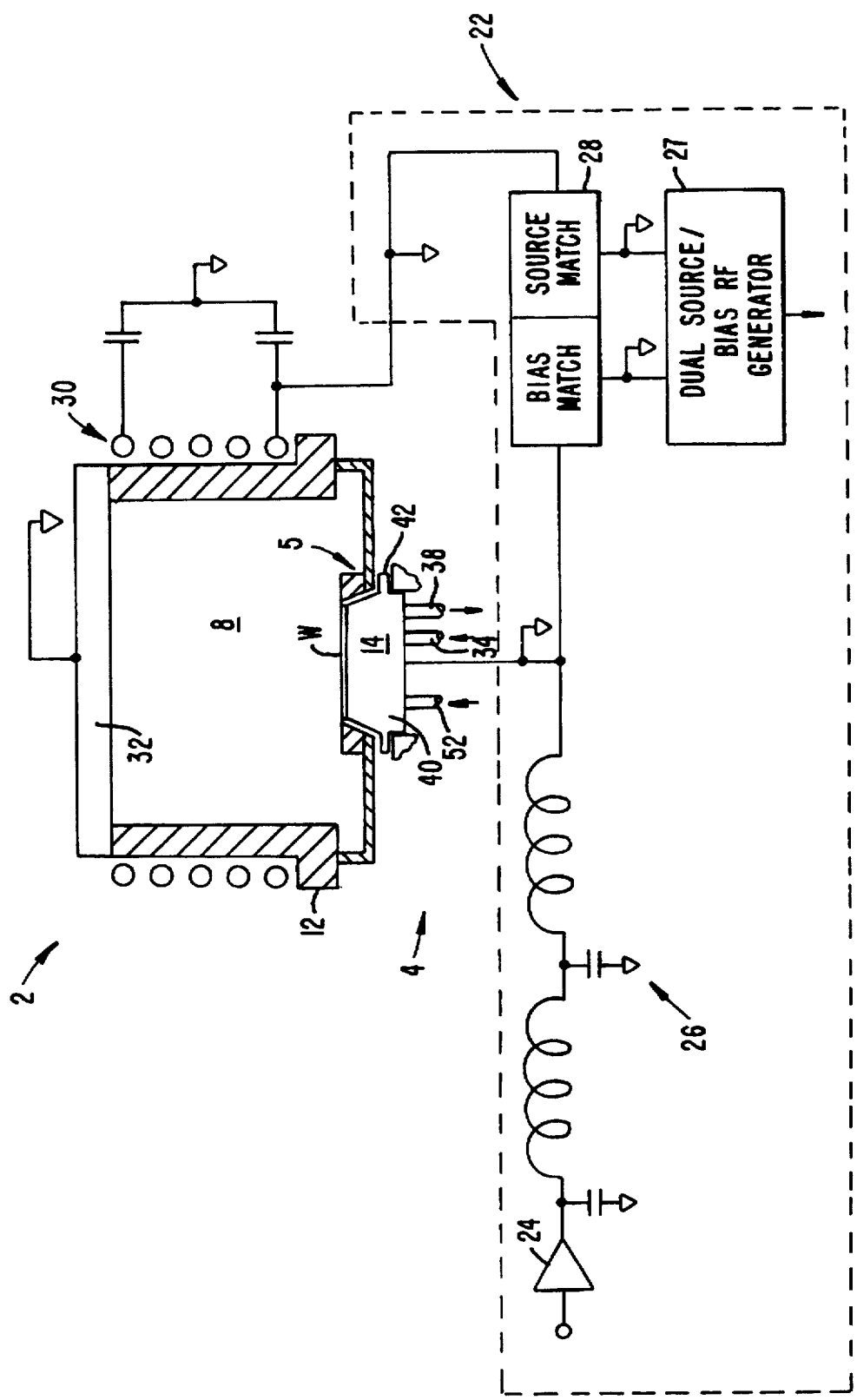
FIG. 1 is a schematic illustration of a high density plasma reaction chamber incorporating an electrostatic chuck and an insulating collar according to the principles of the present invention.

Referring to the drawings in detail, wherein like numerals indicate like elements, a representative wafer processing apparatus 2 is illustrated incorporating an electrostatic chuck 4 for supporting and electrostatically holding a semiconductor wafer W on a pedestal assembly 14 within a high density plasma reaction chamber 8 of the apparatus 2. According to the principles of the present invention, a shield 5 circumscribes pedestal assembly 14 to protect the pedestal from ion bombardment and RF energy from the processing chamber and to channel the RF energy through the chuck, thereby focusing energy onto the wafer.

Referring to FIG. 1, wafer processing apparatus 2 includes an enclosure assembly 12 housing plasma reaction chamber 8 and pedestal assembly 14. Enclosure assembly 12 is attached to a mainframe unit (not shown) which provides electrical, plumbing and other support functions for the chamber. Apparatus 2 will usually be removably attached to the mainframe unit, e.g., with bolts, so that the plasma reaction chamber 8 can be removed for maintenance or repair or can be replaced with another chamber. Mainframe units that are compatible with the illustrative embodiment of wafer processing apparatus 2 are currently commercially available as the Precision 5000™ and the Centura 5200™ systems from Applied Materials, Inc. of Santa Clara. It should be understood, however, that although the invention is shown and described as part of a plasma reaction chamber in a multi chamber processing system, it is not intended to be limited in this manner. That is, the invention can be used in a variety of processing chambers, such as etch, deposition or the like.

Electrostatic chuck 4 includes a conventional electrical circuit 22 for the plasma reaction chamber 8. Circuit 22 includes a DC voltage source 24 and an RF power supply 27. DC voltage source 24 supplies a suitable clamping voltage, e.g., 1000 volts, between the wafer and the pedestal assembly 14 and is coupled to pedestal assembly 14 through a low-pass filter 26 which isolates the DC voltage source 24 from the RF power supply 27. RF source power and RF bias power are each coupled to the RF power supply 27 through an impedance matching network 28, with the source power being coupled to an inductive antenna 30 and the bias power being coupled to pedestal assembly 14. A ground reference for both the RF bias power and DC voltage is a grounded top electrode 32. The DC voltage source 24 supplies the clamping voltage for developing an electric field to electrostatically hold the wafer W to the pedestal. When it is desired to release (or "de-chuck") the wafer W, source 24 may be switched either to a zero output voltage or to a reverse polarity voltage if it is desired to accelerate the release of the wafer.

The plasma reaction chamber employs inductive-coupled RF power to generate and maintain a high-density plasma. RF bias power is capacitively coupled to the plasma via the wafer W and pedestal assembly 14, with the grounded electrode 32 located in the plasma source region providing a return path for bias current. A more detailed description of the illustrative plasma reaction chamber 8 and its operation in processing wafer W can be found in commonly assigned U.S. Pat. No. 5,350,479 to Collins et al., the complete disclosure of which is incorporated herein by reference.

Figure 3:
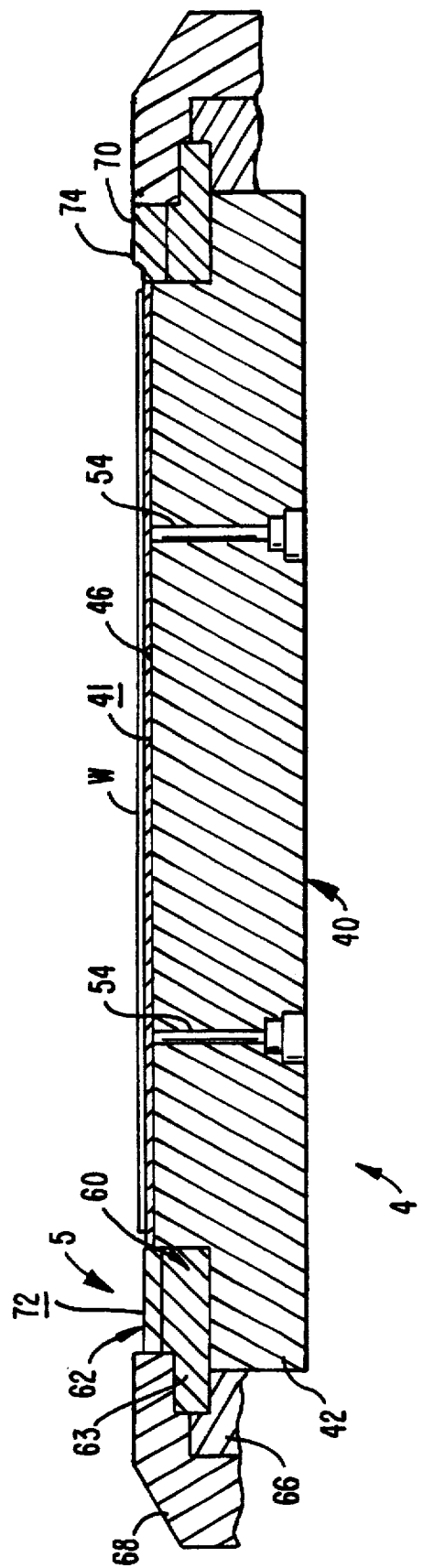
FIG. 3 is a sectional side view of the electrostatic chuck along the lines 3—3 in FIG. 2.

Referring to FIG. 3, pedestal assembly 14 comprises a support body 40 preferably fabricated as an integral block from an electrically conducting material having a high thermal mass and good thermal conductivity to facilitate absorption of heat from a wafer cooled over its upper surface. Aluminum or anodized aluminum is the preferred material for support body 40 because it has a high thermal conductivity of approximately 2.37 watts/cm–°C. and it is generally process compatible with the semiconductor wafer. Support body 40 may comprise other metals, such as stainless steel or nickel, and support body 40 may comprise an additional non-conducting material or the entire support body 40 may comprise a non-conducting or semi-conducting material. In an alternative embodiment, support body comprises a monolithic plate of ceramic. In this configuration, the ceramic plate incorporates a conducting element imbedded therein. The conducting element may comprise a metallic element, green printed mettalization, a mesh screen or the like. Support body 40 defines an annular mounting flange 42 extending outwardly from the outer surface of body 40. A voltage, preferably about 700 Volts, is applied to pedestal assembly 14 by DC voltage source 24 (FIG. 1) to generate the electrostatic attraction force which holds the wafer W in close proximity to the upper surface of body 40.

Figure 2:
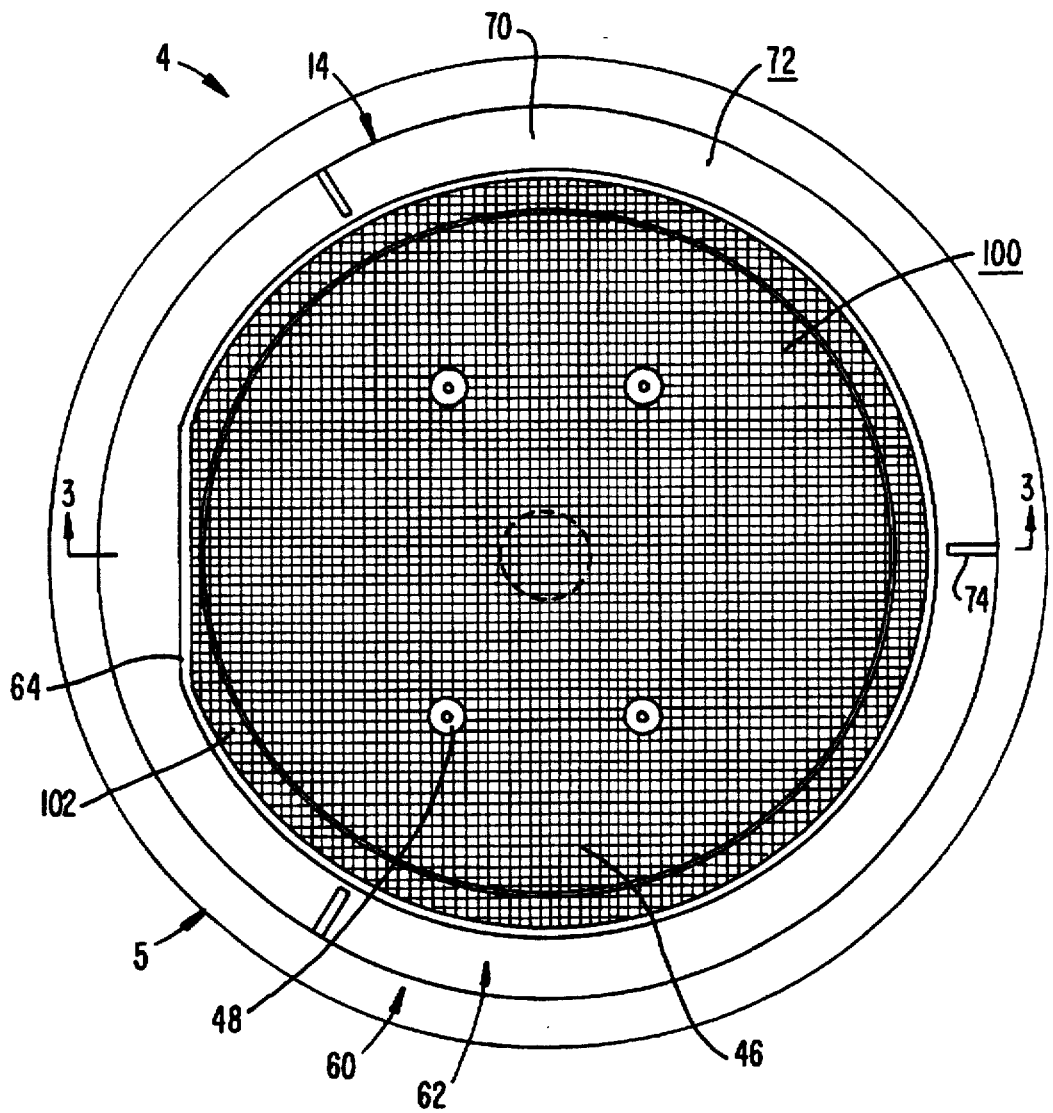
FIG. 2 is a top view of the electrostatic chuck and insulating collar of FIG. 1.

Referring to FIGS. 2 and 3, electrostatic chuck 4 comprises a smooth layer of dielectric material 46 covering upper surface 41 of support body 40 for supporting the lower surface of wafer W. Dielectric layer 46 uniformly covers the entire upper surface 41 of support body 40 except for the region overlying four lift pin holes 48 (FIG. 2). Dielectric layer 46 preferably comprises a thin ceramic dielectric layer 46 (usually on the order of 0.10 to 0.30 inches) of alumina, aluminum oxide or an alumina/titania composite that is plasma sprayed over upper surface 41 of support body 40, as discussed in greater detail below.

Wafer processing apparatus 2 preferably includes a gas distribution system for cooling wafer W. To that end, apparatus 2 comprises a gas inlet 52 (FIG. 1) in communication with a plurality of axially oriented gas conduits 54 (FIG. 3) in support body 40 of pedestal assembly 14. Cooling gas, such as helium, is delivered through gas conduits 54 to the interstitial spaces between the wafer and the upper surface of support body 40. A more detailed description of a suitable gas distribution system can be found in commonly assigned, U.S. Pat. No. 5,350,479 to Collins et al., the complete disclosure of which has already been incorporated by reference.

Figure 4:
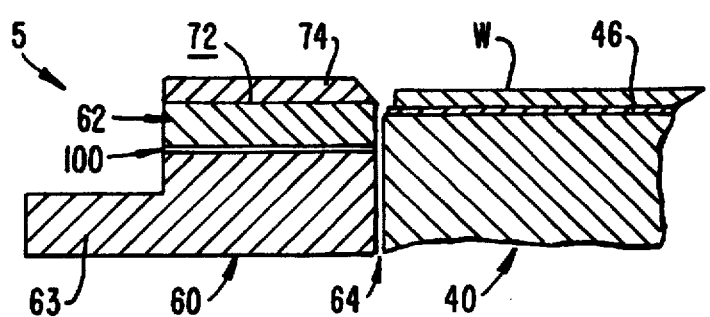
FIG. 4 is an exploded schematic view of a portion of the insulating collar and electrostatic chuck of FIG. 2.

The shield 5 of the present invention will now be described in detail with reference to FIGS. 2–4. Shield 5 comprises a first shield member 60 positioned underneath a second shield member 62. Second shield member 62 is supported by annular flange 42 and an outer support ring 66. Support ring 66 comprises a ceramic RF shield for protecting the lateral surfaces of support body 40. First shield member 60 includes an outer annular flange 63 that engages a collar 68 to hold shield member 60 in place. Collar 68 is preferably a quartz outer jacket for covering a portion of the bottom wall of enclosure assembly 12 to decrease the time required to clean the chamber. Second shield member 62 is preferably supported by first shield member 60 so that the two shield members are separated from each other by a small interstitial gap 100 (FIG. 4). Gap 100 is created by the natural surface roughness of the upper and lower surfaces of first and second shield members 60, 62, respectively. Gap 100 will usually be about 0.5 to 5 mills thick. In the relatively low-pressure environment of the processing chamber (typically on the order of 5 milliTorr), gap 100 establishes a thermal barrier that inhibits thermal conduction between first and second shield members 60, 62. Of course, second shield member 62 may be further separated from first shield member 60 by support members (not shown) located between shield members 60, 62, if desired.

As shown in FIGS. 2 and 3, first and second shield members 60, 62 preferably have an inner diameter larger than the diameter of support body 40 to define a gap 64 therebetween. Gap 64 provides room for expansion of support body 40 when it is heated in process chamber 8 and also ensures that the electrostatic chuck can be inserted and removed within shield members 60, 62 without damaging the chuck or the shield members. Shield members 60, 62 preferably comprise an insulating material, i.e., a dielectric material, that serves to prevent or at least inhibit the hot plasma in chamber 8 above the wafer W from contacting, and thereby eroding, part of the electrostatic chuck 4. However, it should be noted that members 60, 62 are not necessarily limited to an insulating material and, in fact, applicant has found that shield members 60, 62 comprising a semiconducting material may effectively protect chuck 4 from the plasma within chamber 8.

Second shield member 62 is a thin ring 70 having a substantially planar upper surface 72 that is exposed to deposition from gases in process chamber 8. First shield member 60 is isolated from chamber 8 by second shield member 62 and collar 68 and, therefore, generally does not receive oxide deposits thereon. Second shield member 62 will have a thermal mass substantially less than the thermal mass of first shield member 60. Usually, the thermal mass ratio between first and second shield members 60, 62 is in the range of about 2-1 to 10-1 and preferably about 4-1 to 7-1. In addition, the ratio of the surface area of exposed upper surface 72 to the thermal mass of shield member 62 is relatively high, usually about 0.1 to 5 $cm^2 K/J$ and preferably about 1 to 1.6 $cm^2 K/J$.

Since shield members 60, 62 are effectively isolated from each other, the high ratio of exposed surface area to thermal mass of second shield member 62 causes member 62 to be heated to a substantially high temperature from the RF energy in the chamber. Since the oxide deposition rate is generally inversely proportional to the temperature of a surface in the process chamber, the heat received by the second shield member inhibits oxide deposition on the exposed upper surface. Thus, the geometry of shield members 62 (i.e., the high ratio of exposed surface to thermal mass) minimizes the rate of deposition on upper surface 72. In addition, the clean rate or deposition removal rate of the shield is typically a function of its temperature (i.e., the hotter the shield becomes during processing, the faster it can be cleaned). Therefore, the clean rate of second shield member 62 will be increased, which reduces the downtime of apparatus 2, thereby enhancing the throughput of the process.

As best shown in FIG. 4, first and second shield members 60, 62 are preferably sized so that upper surface 72 of shield member 62 is positioned below the upper surface of the wafer when the wafer rests on or is adjacent to the upper surface of dielectric layer 46. Positioning shield 5 below the upper surface of the wafer further lowers the oxide deposition rate on upper surface 72 and provides an improved line of sight to the wafer edges. Therefore, the edges of the wafer may receive a higher deposition rate than if the shield 5 were to extend above the wafer. In some processes, this may be advantageous to compensate for the higher deposition rate in the center of the wafer that typically occurs during processing. The second shield member 62 preferably extends above the upper planar surface of dielectric layer 46 (the insulating element) by about 0 to 5 mm.

Second shield member 62 further includes a number of elongate tabs 74, preferably at least three, circumferentially spaced about upper surface 72. Since upper surface 72 is positioned below the surface of the wafer, tabs 74 serve to hold the wafer on dielectric layer 46 when the electrostatic force provided by electrical circuit 22 and chuck 4 is not sufficient for this purpose (e.g., due to pressure from excess helium cooling gas underneath the wafer). Preferably, tabs 74 have a longitudinal axis facing radially inward toward the center of the chuck 4. This relatively slender profile minimizes deposition on tabs 74 to reduce interference with the gas flow onto the wafer and to decrease the deposition rate on tabs 74. Tabs 74 will preferably have a height above the wafer surface selected to suitably hold the wafer onto dielectric layer 46 and to minimize deposition thereon. Preferably, tabs 74 will extend about 0 mils to 30 mils above the wafer surface.

The method for processing wafer W will now be discussed with reference to FIGS. 1-4. Wafer W is first positioned over the planar upper surface of dielectric layer 46 with a support blade of a robotic wafer transfer system (not shown). The bottom surface of wafer W is then engaged by lift fingers (not shown) by extending the fingers through holes 48 in support body 40 and dielectric layer 46 (see FIG. 2). The extended lift fingers raise wafer W off of the robotic transfer system and the support blade is retracted. The wafer W is then lowered toward the upper surface of dielectric layer 46 so that support element 40 supports wafer W.

To secure wafer W to support element 40, a clamping voltage of about 700 volts is applied from voltage source 24 to pedestal 14 to generate an electrostatic attractive force which holds wafer W on or in close proximity to the upper surface of dielectric layer 46 (FIG. 1). The interior of chamber 8 is then evacuated to a suitable vacuum pressure and process gases are introduced into chamber 8 and distributed uniformly over wafer W via a showerhead (not shown) in a conventional manner. RF power supply 27 generates an inductively coupled RF power to generate a high density, plasma within chamber 8 for etching and/or depositing a layer of material, e.g., $SiO_2$, on the wafer. The RF power supply imposes a large heat load on the wafer W and shield members 60, 62 during processing.

During a deposition process, oxide from process gases is deposited onto wafer W and onto a substantial portion of the exposed surfaces of the chamber, such as the inner walls of enclosure 12 and upper surface 72 of second shield member 62. Since the thermal mass of shield member 62 is relatively small compared to the surface area of surface 72, second shield member 62 will receive a relatively large amount of heat from the RF power supply. This decreases the rate of oxide deposition onto upper surface 72. In addition, surface 72 is positioned below the upper surface of the wafer to further reduce the deposition thereon (FIG. 4). During cleaning, the relatively lower thermal mass of second shield member 62 increases its clean rate, which enhances the throughput of the process.

While the above is a full description of the specific embodiments, various modifications, alternative constructions and equivalents may be used. Therefore, the above description and illustrations should not be taken as limiting the scope of the present invention defined by the appended claims. For example, it should be noted that the invention is not limited to a single-wafer chamber as described above and shown in the enclosed drawings. In fact, electrostatic chuck and shield could be installed in batch chambers that simultaneously perform processing on a plurality of wafers. In addition, the invention would be suitable for use in a multi-wafer chamber that sequentially performs individual processing steps on each of the wafers.

What is claimed is:

1. A wafer processing apparatus comprising:
   an electrically insulating element having a substantially planar surface for receiving a wafer;
   an electrically conductive element adjacent to a surface of the insulating element opposite the substantially planar surface;
   a first shield member at least partially circumscribing the electrically conductive element; and
   a second, separate shield member supported over the first shield member and positioned to at least partially circumscribe the electrically insulating element;
   wherein the second shield member has a substantially smaller thermal mass than the first shield member.

2. The apparatus of claim 1 wherein the first and second shield members are substantially thermally isolated from each other.

3. The apparatus of claim 2 wherein the first and second shield members form a solid-to-solid contact with each other, the shield members defining interstitial spaces therebetween, the interstitial spaces forming a substantial thermal barrier between the shield members in a low-pressure environment.

4. The apparatus of claim 2 wherein the second shield member defines an upper exposed surface having a surface area, the ratio of the surface area of the upper exposed surface to the thermal mass of the second shield member being about 1 to 1.6 $cm^2 K/Joule$.

5. The apparatus of claim 1 wherein the first and second shield members comprise an electrically insulating material.

6. The apparatus of claim 1 wherein the first and second shield members are annular rings substantially circumscribing the insulating and conductive elements.

7. The apparatus of claim 1 wherein the second shield member defines an upper exposed surface and a plurality of projections extending from the upper exposed surface for holding a semiconductor wafer between projections.

8. The apparatus of claim 7 wherein the projections are elongate tabs circumferentially spaced about the upper exposed surface of the second shield member.

9. The apparatus of claim 1 wherein the upper surface of the second shield member extends above the planar surface of the insulating element by a distance less than the thickness of the wafer.

10. The apparatus of claim 1 wherein the second shield member extends above the planar surface of the insulating element by about 0 to 5 mm.

11. The apparatus of claim 1 further comprising means for generating an electrostatic force between the wafer and the conductive element to hold the wafer to the insulating element.

12. An electrostatic chuck for holding a wafer during processing in a plasma reaction chamber comprising:
   a pedestal having a metallic upper surface;
   a layer of dielectric material formed on the upper surface of the pedestal, the dielectric layer having an upper surface for receiving a wafer; and
   a shield member substantially circumscribing the pedestal, the shield member comprising first and second portions substantially thermally isolated from each other;
   wherein the second shield member is positioned to isolate the first shield member from the plasma reaction chamber and wherein the second shield member has a substantially smaller thermal mass than the first shield member.

13. The chuck of claim 12 wherein the first and second portions of the shield member form a solid-to-solid contact with each other, said portions defining interstitial spaces therebetween, the interstitial spaces forming a substantial thermal barrier between said portions in a low-pressure environment.

14. An apparatus for fabricating an integrated circuit device comprising:
   an enclosure assembly housing a processing chamber;
   an electrostatic chuck disposed within the processing chamber, the electrostatic chuck comprising:
      an electrically insulating layer having a substantially planar surface for receiving a wafer; and
      an electrode opposing a wall surface of the electrically insulating layer opposite the planar surface;
   a first electrically insulating shield member substantially circumscribing the electrostatic chuck;
   a second electrically insulating shield member supported on the first shield member and positioned to substantially circumscribe the electrical insulating layer, the first and second shield members being substantially thermally isolated from each other;
   wherein the second shield member has a substantially smaller thermal mass than the first shield member; and
   a voltage source coupled to the electrode for applying a voltage between the wafer and the electrode to generate a columbic force for holding the wafer onto the insulating layer.

15. A method for fabricating an integrated circuit device comprising:
   positioning a semiconductor wafer adjacent to a substantially planar surface of an electrically insulating element within a process chamber, the electrically insulating element being disposed over an electrode;
   shielding the electrode with a shield member substantially circumscribing the electrode, the shield member comprising first and second separate portions; and
   shielding the first portion of the shield member from the process chamber with the second portion of the shield member;
   wherein the first and second portions of the shield member comprise an electrically insulating or an electrically semiconducting material.

16. The method of claim 15 further comprising inhibiting deposition of gas onto an exposed surface of the second portion of the shield member.

17. The method of claim 16 wherein the inhibiting step is carried out by substantially thermally isolating the first portion of the shield member from the second portion of the shield member and heating the second portion during processing to reduce deposition of gas onto an exposed surface of the second portion.

18. The method of claim 17 wherein the thermally isolating step is carried out by positioning the first portion on the second portion in solid-to-solid contact with each other and maintaining a low pressure within the process chamber such that interstitial spaces between the first and second portions create a thermal barrier.

19. The method of claim 17 further comprising selecting a ratio of exposed surface area to thermal mass of about 1 to 1.6 $cm^2 K/J$ for the second portion of the shield member.

20. The method of claim 16 wherein the inhibiting step is carried out by positioning the exposed portion below an upper surface of the wafer.

21. The method of claim 15 further comprising holding the wafer on the planar surface of the electrically insulating member with a plurality of projections extending from the second portion of the shield member.

22. The method of claim 15 further comprising generating an electrostatic force between the wafer and the insulating element to hold the wafer to the insulating element.

23. The method of claim 22 wherein the generating step comprises:

applying voltage between the electrically conducting element and the wafer; and generating a coulumbic attraction force between the wafer and the insulating element.

* * * * *